(12) United States Patent
Vogan et al.

(10) Patent No.: US 8,990,614 B2
(45) Date of Patent: Mar. 24, 2015

(54) PERFORMANCE OF A SYSTEM HAVING NON-VOLATILE MEMORY

(71) Applicant: Apple Inc., Cupertino, CA (US)

(72) Inventors: Andrew W. Vogan, San Jose, CA (US); Daniel J. Post, Campbell, CA (US)

(73) Assignee: Apple Inc., Cupertino, CA (US)

( * ) Notice: Subject to any disclaimer, the term of this patent is extended or adjusted under 35 U.S.C. 154(b) by 202 days.

(21) Appl. No.: 13/829,692

(22) Filed: Mar. 14, 2013

(65) Prior Publication Data

US 2014/0281687 A1 Sep. 18, 2014

(51) Int. Cl.
*G06F 11/00* (2006.01)
*G06F 11/16* (2006.01)
*G06F 11/10* (2006.01)
*G06F 11/07* (2006.01)
*G06F 12/02* (2006.01)

(52) U.S. Cl.
CPC ........ *G06F 11/1666* (2013.01); *G06F 11/1068* (2013.01); *G06F 11/073* (2013.01); *G06F 12/0246* (2013.01)
USPC ........................................................ 714/6.13

(58) Field of Classification Search
CPC ............ G06F 11/1068; G06F 12/0246; G06F 11/1092; G06F 11/073; G06F 2212/7205; G06F 3/064; G06F 11/2094
See application file for complete search history.

(56) References Cited

U.S. PATENT DOCUMENTS

| | | | | |
|---|---|---|---|---|
| 5,530,960 A | * | 6/1996 | Parks et al. | 710/5 |
| 5,905,858 A | * | 5/1999 | Jeddeloh | 714/52 |
| 2005/0050383 A1 | * | 3/2005 | Horn et al. | 714/6 |
| 2005/0162947 A1 | * | 7/2005 | Kim et al. | 365/200 |
| 2006/0031710 A1 | * | 2/2006 | Jo | 714/5 |
| 2007/0103978 A1 | * | 5/2007 | Conley et al. | 365/185.09 |
| 2014/0006847 A1 | * | 1/2014 | Guo et al. | 714/6.1 |

* cited by examiner

*Primary Examiner* — Charles Ehne
(74) *Attorney, Agent, or Firm* — Van Court & Aldridge LLP (57) ABSTRACT

Systems and methods are disclosed for improving performance of a system having non-volatile memory ("NVM"). The system can vertically re-vector defective blocks of a user region of the NVM to other blocks having the same plane or die's plane ("DIP") but corresponding to a dead region of the NVM. Then, the system can select any band with more than one defective block and vertically re-vector one of its defective blocks to a band that has no defective blocks. At run-time, the system can monitor the number of vertical re-vectors per DIP. If at least one vertical re-vector has been performed on all DIPs of the NVM, a band of the user region can be allocated for the dead region.

27 Claims, 9 Drawing Sheets

PERFORMANCE OF A SYSTEM HAVING NON-VOLATILE MEMORY

BACKGROUND OF THE DISCLOSURE

NAND flash memory, as well as other types of non-volatile memories ("NVMs"), are commonly used for mass storage. For example, consumer electronics such as portable media players often include flash memory to store music, videos, and other media.

An NVM can include multiple bands, and each band can include multiple blocks. Over time, one or more blocks of an NVM may develop defects, which are generally not distributed evenly across the various bands. Thus, when a few bands of the NVM have a substantially greater number of defective blocks as compared to other bands, overall system performance can suffer.

SUMMARY OF THE DISCLOSURE

Systems and methods are disclosed for improving performance of a system having non-volatile memory ("NVM"). The system can vertically re-vector defective blocks of a user region of an NVM to other blocks having the same plane or die's plane ("DIP") but corresponding to a dead region of the NVM. As used herein, a "vertical re-vectoring" process can be a process in which a defective block of a first band of an NVM is re-vectored to a non-defective block of a second band, where the second band is in the same plane or DIP as the first band.

After the defective blocks have been vertically re-vectored, the user region can be inspected. In particular, the system can select any band with more than one defective block and vertically re-vector one of its defective blocks to a band in the user region that has no defective blocks. At run-time, the system can monitor the number of vertical re-vectors per DIP. If at least one vertical re-vector has been performed on all DIPs of the NVM, another band of the user region can be allocated for the dead region.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Systems and methods for improving performance of a system having non-volatile memory ("NVM") are provided. The system can vertically re-vector defective blocks of a user region of the NVM to other blocks having the same plane or die's plane ("DIP") but corresponding to a dead region of the NVM. As used herein, a "vertical re-vectoring" process can be a process in which a defective block of a first band of an NVM can be re-vectored to a non-defective block of a second band, where the second band is in the same plane or DIP as the first band.

After the defective blocks have been vertically re-vectored, the user region can be inspected. In particular, the system can select any band with more than one defective block and vertically re-vector one of its defective blocks to a band in the user region that has no defective blocks (e.g., a pristine band). At run-time, the system can monitor the number of vertical re-vectors per DIP. If at least one vertical re-vector has been performed on all DIPs, a band of the user region can be allocated for the dead region.

Figure 1:
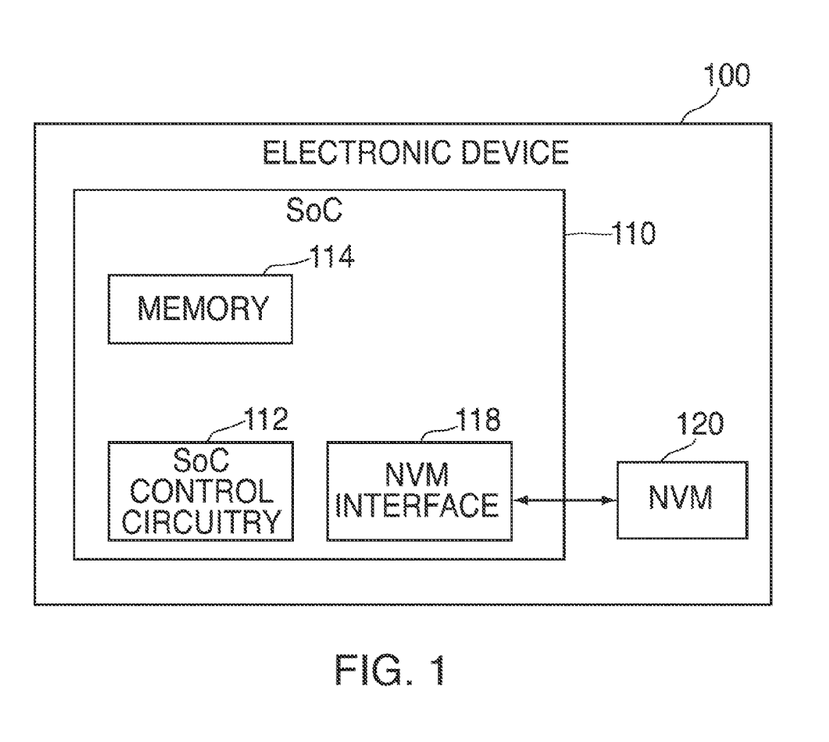
FIGS. 1 and 2 are block diagrams of electronic devices configured in accordance with various embodiments of the invention.

FIG. 1 illustrates a block diagram of electronic device 100. In some embodiments, electronic device 100 can be or can include a portable media player, a cellular telephone, a pocket-sized personal computer, a personal digital assistance ("PDA"), a desktop computer, a laptop computer, and any other suitable type of electronic device.

Electronic device 100 can include system-on-a-chip ("SoC") 110 and non-volatile memory ("NVM") 120. Non-volatile memory 120 can include a NAND flash memory based on floating gate or charge trapping technology, NOR flash memory, erasable programmable read only memory ("EPROM"), electrically erasable programmable read only memory ("EEPROM"), Ferroelectric RAM ("FRAM"), magnetoresistive RAM ("MRAM"), or any combination thereof.

NVM 120 can be organized into "blocks", which can the smallest erasable unit, and further organized into "pages", which can be the smallest unit that can be programmed or read. In some embodiments, NVM 120 can include multiple integrated circuits (e.g., one or more dies), where each integrated circuit may have multiple blocks. Memory locations (e.g., blocks or pages of blocks) from corresponding integrated circuits may be logically grouped together to form "bands". Bands can provide operational parallelism, thereby enabling programming, reading, and erase operations to be performed in parallel for blocks located on different integrated circuits. Each memory location of NVM 120 can be referenced using a physical address (e.g., a physical page address or physical block address).

NVM 120 can be a single-plane or a multi-plane device. In the case of a multi-plane NVM, the block corresponding to each die-plane combination can be assigned a logical die's plane ("DIP") number. Therefore, the DIP can be a linear representation of various die-plane combinations of NVM 120. For example, Table 1 shows illustrative assignments of DIPs to various die-plane combinations for a dual-die dual-plane NVM (e.g., the NVM has two dies and each die is associated with a block in each plane).

TABLE 1

| Die | Plane | DIP |
|-----|-------|-----|
| 0 | 0 | 0 |
| 0 | 1 | 1 |
| 1 | 0 | 2 |
| 1 | 1 | 3 |

As shown in Table 1, the block corresponding to die 0 and plane 0 can be assigned a DIP of 0. Similarly, the block corresponding to die 0 and plane 1 can be assigned a DIP of 1, and so on. Because packages often have separate physical buses, the particular mapping of DIPs to their physical locations as given in Table 1 can allow multiple physical buses to run at the same time. This can improve overall system performance by maximizing cumulative bandwidth and reducing locality of power consumption. Persons skilled in the art will appreciate however that the assignments shown in Table 1 are merely illustrative, and that any other suitable assignments can be used.

In some cases, device 100 can store a lookup table (e.g., in NVM 120 or memory 114) that can include the multiple DIPs of NVM 120 and their corresponding physical information (e.g., channels, chip enables, dies, planes, communication protocols, etc.). Accordingly, the lookup table can be used to convert a particular DIP into its corresponding physical information.

System-on-a-chip 110 can include SoC control circuitry 112, memory 114, and NVM interface 118. SoC control circuitry 112 can control the general operations and functions of SoC 110 and the other components of SoC 110 or device 100. For example, responsive to user inputs and/or the instructions of an application or operating system, SoC control circuitry 112 can issue read or write requests to NVM interface 118 to obtain data from or store data in NVM 120.

SoC control circuitry 112 can include any combination of hardware, software, and firmware, and any components, circuitry, or logic operative to drive the functionality of electronic device 100. For example, SoC control circuitry 112 can include one or more processors that operate under the control of software/firmware stored in NVM 120 or memory 114.

Memory 114 can include any suitable type of volatile memory, such as random access memory ("RAM") (e.g., static RAM ("SRAM"), dynamic random access memory ("DRAM"), synchronous dynamic random access memory ("SDRAM"), double-data-rate ("DDR") RAM), cache memory, read-only memory ("ROM"), or any combination thereof. In some embodiments, memory 114 may act as the main memory for any processors implemented as part of SoC control circuitry 112.

NVM interface 118 may include any suitable combination of hardware, software, and/or firmware configured to act as an interface or driver between SoC control circuitry 112 and NVM 120. For any software modules included in NVM interface 118, corresponding program code may be stored in NVM 120 or memory 114.

NVM interface 118 can perform a variety of functions that allow SoC control circuitry 112 to access NVM 120 and to manage the memory locations (e.g., pages, blocks, bands, integrated circuits) of NVM 120 and the data stored therein. For example, NVM interface 118 can interpret the read or write requests from SoC control circuitry 112, perform wear leveling, and generate read and program instructions compatible with the bus protocol of NVM 120.

While NVM interface 118 and SoC control circuitry 112 are shown as separate modules, this is intended only to simplify the description of the embodiments of the invention. It should be understood that these modules may share hardware components, software components, or both. For example, SoC control circuitry 112 may execute a software-based memory driver for NVM interface 118.

In some embodiments, electronic device 100 can include a target device, such as a flash memory drive or SD card, that includes NVM 120 and some or all portions of NVM interface 118. In these embodiments, SoC 110 or SoC control circuitry 112 may act as the host controller for the target device. For example, as the host controller, SoC 110 can issue read and write requests to the target device.

Figure 2:
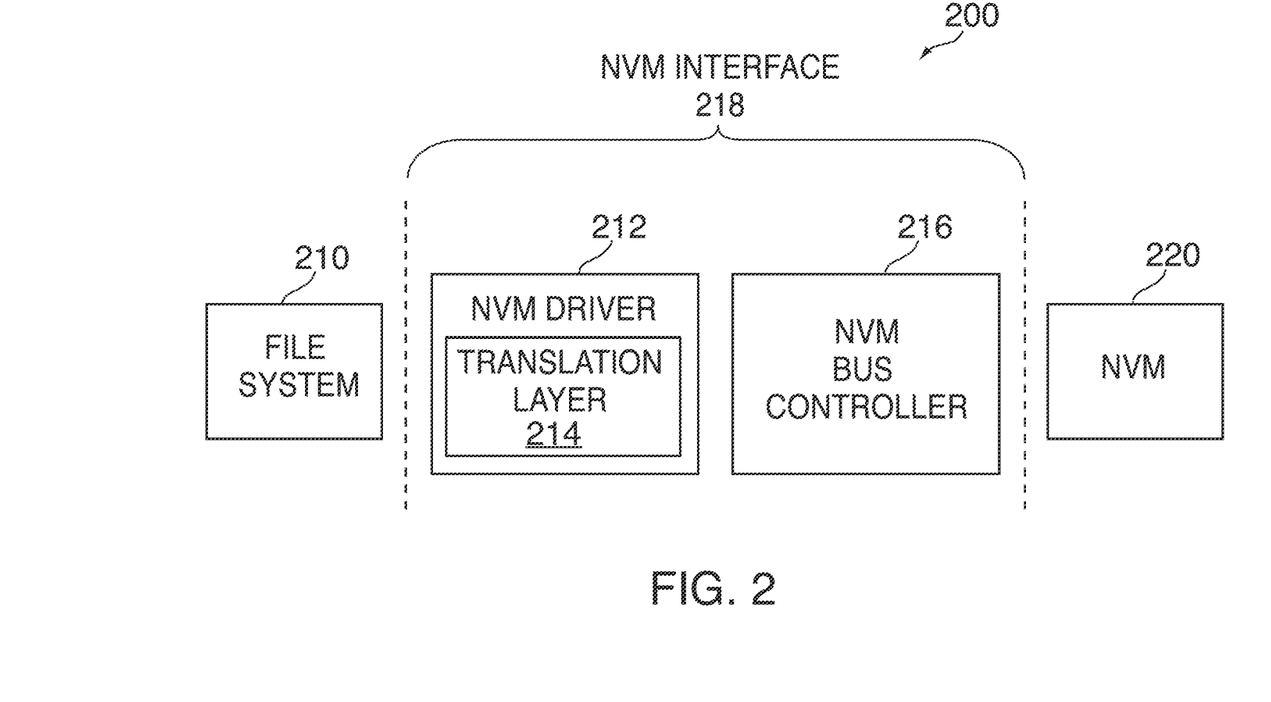

FIG. 2 illustrates a block diagram of electronic device 200, which may illustrate in greater detail some of the firmware, software, and/or hardware components of electronic device 100 (FIG. 1) in accordance with various embodiments. Electronic device 200 may have any of the features and functionalities described above in connection with FIG. 1, and vice versa. As shown, dashed lines demarcate the layers. It is understood that the depiction of which components fall within the demarcation lines are merely illustrative and that one or more components can be affiliated with a different layer.

Electronic device 200 can include file system 210, NVM driver 212, NVM bus controller 216, and NVM 220. In some embodiments, file system 210 and NVM driver 212 may be software or firmware modules, and NVM bus controller 216 and NVM 220 may be hardware modules. Accordingly, in these embodiments, NVM driver 212 may represent the software or firmware aspect of NVM interface 218, and NVM bus controller 216 may represent the hardware aspect of NVM interface 218.

File system 210 can include any suitable type of file system, such as a File Allocation Table ("FAT") file system or a Hierarchical File System Plus ("HFS+"), and may be part of the operating system of electronic device 200 (e.g., part of SoC control circuitry 112 of FIG. 1). In some embodiments, file system 210 may include a flash file system, which provides a logical-to-physical mapping of pages. In these embodiments, file system 210 may perform some or all of the functionalities of NVM driver 212 discussed below, and therefore file system 210 and NVM driver 212 may or may not be separate modules.

File system 210 may manage file and folder structures for the application and operating system. File system 210 may operate under the control of an application or operating system running on electronic device 200, and may provide write and read requests to NVM driver 212 when the application or operating system requests that information be read from or stored in NVM 220. Along with each read or write request, file system 210 can provide a logical address to indicate where the user data should be read from or written to, such as a logical page address or a logical block address with a page offset.

File system 210 may provide read and write requests to NVM driver 212 that are not directly compatible with NVM 220. For example, the logical addresses may use conventions or protocols typical of hard-drive-based systems. A hard-drive-based system, unlike flash memory, can overwrite a memory location without first performing a block erase. Moreover, hard drives may not need wear leveling to increase the lifespan of the device. Therefore, NVM interface 218 can perform any functions that are memory-specific, vendor-specific, or both to handle file system requests and perform other management functions in a manner suitable for NVM 220.

NVM driver 212 can include translation layer 214. In some embodiments, translation layer 214 may be or include a flash translation layer ("FTL"). On a write request, translation layer 214 can map the provided logical address to a free, erased physical location on NVM 220. On a read request, translation layer 214 can use the provided logical address to determine the physical address at which the requested data is stored. Because each NVM may have a different layout depending on the size or vendor of the NVM, this mapping operation may be memory and/or vendor-specific.

In addition to logical-to-physical address mapping, translation layer 214 can perform any other suitable functions that may be typical of flash translation layers, such as garbage collection ("GC") and wear leveling.

In some embodiments, NVM driver 212 may interface with NVM bus controller 216 to complete NVM access requests (e.g., program, read, and erase requests). Bus controller 216 may act as the hardware interface to NVM 220, and can communicate with NVM 220 using the bus protocol, data rate, and other specifications of NVM 220.

NVM interface 218 may manage NVM 220 based on memory management data, sometimes referred to herein as "metadata". The metadata may be generated by NVM driver 212 or may be generated by a module operating under the control of NVM driver 212. For example, metadata can include any information used for managing the mapping between logical and physical addresses, bad block management, wear leveling, ECC data used for detecting or correcting data errors, or any combination thereof. The metadata may include data provided by file system 210 along with the user data, such as a logical address. Thus, in general, "metadata" may refer to any information about or relating to user data or used generally to manage the operation and memory locations of a non-volatile memory.

NVM interface 218 may be configured to store metadata in NVM 220. In some embodiments, NVM interface 218 may store metadata associated with user data at the same memory location (e.g., page) in which the user data is stored. For example, NVM interface 218 may store user data, the associated logical address, and ECC data for the user data at one or more memory locations of NVM 220. NVM interface 218 may also store other types of metadata about the user data in the same memory location.

NVM interface 218 may store the logical address so that, on power-up of NVM 220 or during operation of NVM 220, electronic device 200 can determine what data resides at that location. In particular, because file system 210 may reference the user data according to its logical address and not its physical address, NVM interface 218 may store the user data and logical address together to maintain their association. This way, even if a separate table maintaining the physical-to-logical mapping in NVM 220 becomes outdated, NVM interface 218 may still determine the proper mapping at power-up or reboot of electronic device 200, for example.

Figure 3:
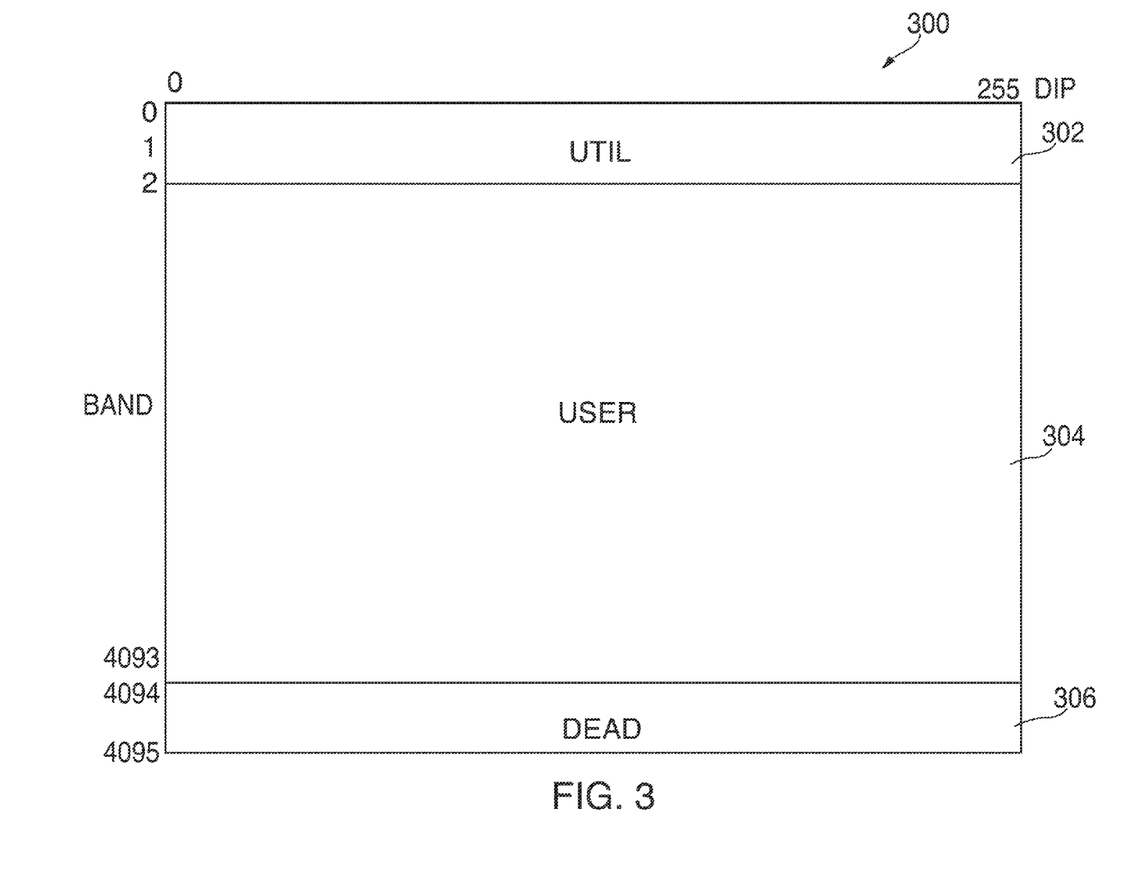
FIG. 3 is a two-dimensional representation of a non-volatile memory in accordance with various embodiments of the invention.

As discussed above, an NVM (e.g., NVM 120 of FIG. 1 or NVM 220 of FIG. 2) can be organized into DIPs and bands. For example, FIG. 3 shows a two-dimensional representation of NVM 300. This two-dimensional representation of NVM 300 can be used for purposes of defect management. NVM 300 can be the same as or similar to NVM 120 (FIG. 1) or NVM 220 (FIG. 2).

The x-axis (e.g., horizontal axis) of the two-dimensional representation of NVM 300 can correspond to multiple DIPs of NVM 300. The number of DIPs can be equal to the plane capability of a die multiplied by the number of dies. As illustrated, NVM 300 includes 256 DIPs. Persons skilled in the art will appreciate that NVM 300 can have any suitable number of DIPs. For example, for a four-die, dual-plane NVM, there can be eight DIPs.

The y-axis (e.g., the vertical axis) of the two-dimensional representation of NVM 300 can correspond to multiple bands of NVM 300. As illustrated, NVM 300 includes 4096 bands. However, persons skilled in the art will appreciate that NVM 300 can include any suitable number of bands.

Bands can be formed by virtually linking or "striping" together one or more blocks of NVM 300. Blocks need not be in the same row of each die to be virtually linked as a band. In fact, blocks may be chosen randomly from two or more dies to form a band. In some embodiments, a band can include only one block. Bands provide operational parallelism, thereby enabling programming, reading, and erase operations to be performed in parallel for blocks located on different dies. A translation layer (e.g., translation layer 214 of FIG. 2) being implemented in an NVM interface (e.g., NVM interface 118 of FIG. 1 or NVM interface 218 of FIG. 2) may keep track of bands.

Persons skilled in the art will appreciate that FIG. 3 is merely meant to provide a two-dimensional representation of NVM 300 and does not indicate an actual, physical layout of the non-volatile memory. For example, although the DIPs are shown in ascending order in FIG. 3, this is merely to illustrate the organizational relationship of the DIPs, and does not indicate an actual, physical layout of NVM 300. Thus, in the actual, physical layout of NVM 300, these DIPs may or may not be located near one another (e.g., in glass or silicon space).

NVM 300 can include one or more regions such as, for example, utility region 302, user region 304, and dead region 306. Any suitable number of bands may be allocated to each of regions 302-306. For example, as shown in FIG. 3, NVM 300 can have two bands that are partitioned to utility region 302, two bands that are partitioned to dead region 306, and 4092 bands that are partitioned to user region 304.

Utility region 302 can be used to store utility data (e.g., firmware, defect maps, etc.) for the system. Utility region 302 can occupy a discrete number of bands (e.g., bands 0 and 1 of NVM 300), and can be static in size. In most systems, utility region 302 can have a minimum size of one band.

User region 304 can include bands (e.g., bands 2 to 4093) and blocks in bands that are in circulation and thus available to be used by a translation layer (e.g., translation layer 214 of FIG. 2) for storing data. The blocks in the bands of user region 304 can be subject to various translation layer policies such as, for example, wear leveling, near miss, etc.).

Dead region 306 can include bands (e.g., bands 4094 and 4095) that have been completely consumed as spares by user region 304. Thus, dead region 306 may include only defective blocks. By parting out one or more bands at the end of band space for dead region 306, defects of NVM 300 can coagulate at the end of band space.

Figure 4:
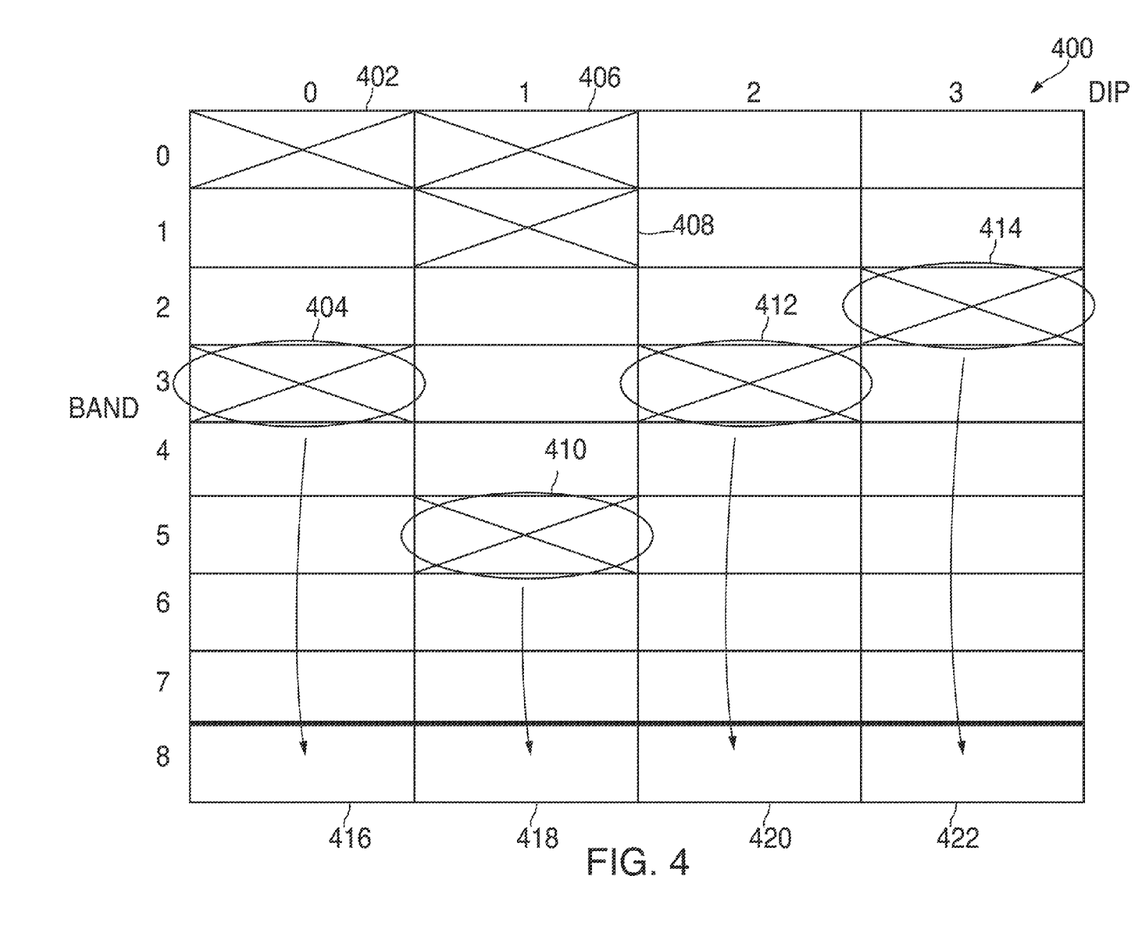
FIG. 4 is another two-dimensional representation of a non-volatile memory in accordance with various embodiments of the invention.

Referring now to FIG. 4, a two-dimensional representation of non-volatile memory 400 is shown. NVM 400 may be similar to NVM 300 of FIG. 3. That is, the x-axis of the two-dimensional representation of NVM 400 may correspond to DIPs, and the y-axis of the two-dimensional representation may correspond to bands. For the sake of simplicity, however, NVM 400 is illustrated as having only four DIPs (e.g., DIPs 0-3) and nine bands (e.g., bands 0-8).

Initially, bands 0-8 can be allocated as bands for a user region of NVM 400 (e.g., similar to user region 304 of FIG. 3). For the sake of simplicity, a utility region has been omitted from NVM 400.

As illustrated in FIG. 4, NVM 400 can include multiple blocks, where each block can be defined by an intersection of a DIP and a band. Blocks that are crossed out with an "X" may represent defective blocks. For example, blocks 402 and 404 of DIP 0 may be defective blocks. As another example, blocks 406, 408, and 410 of DIP 1 may be defective blocks.

In general, defective blocks can be randomly distributed in an NVM (e.g., a normal distribution of defects per band). Because defective blocks may be stepped over when NVM 400 is being programmed or read, defective blocks may sometimes be referred to as "step overs".

Because step overs can decrease the functional size of bands, bands with step overs tend to have slower performance as compared to bands without any step overs. In the example illustrated in FIG. 4, for instance, a band that has no step overs (e.g., bands 4, 6, 7, and 8) can have 100% performance, whereas a band that has one step over (e.g., bands 1, 2, and 5) can have 75% performance. Furthermore, a band that has two step overs (e.g., bands 0 and 3) can have 50% performance. Table 2 illustrates the various performance levels and the corresponding number of bands of NVM 400 as shown in FIG. 4.

TABLE 2

|  | 100% Performance | 75% Performance | 50% Performance |
| --- | --- | --- | --- |
| Number of Bands | 4 | 3 | 2 |

When a system is fully utilized, bands can be programmed and erased, for example, by a host or a garbage collection process. The balance between work being performed by the host and worked performed during garbage collection can depend on the number of clean bands currently available. When all bands in a user region (e.g., user region 304 of FIG. 3) of an NVM have approximately the same number of functioning blocks (e.g., no defective blocks or only one defective block per band), the host can have a more consistent expectation of performance across the NVM physical space. In contrast, when a band of the user region has significantly poorer performance (e.g., half of the band has defective blocks) as compared to the other bands of the user region, system performance may stall. For example, garbage collection may take twice as long for a half-bandwidth band as compared to other bands.

One approach to achieving consistent performance can be configuring the NVM such that all bands in the user region have the same size (e.g., all bands have 100% performance). However, this can be a waste of physical space because the distribution of defective blocks per DIP may not be consistent across the NVM. The system should be able to tolerate variances in the quality of NVMs from the manufacturer.

Accordingly, a system can apply a vertical re-vectoring process in which a defective block of a first band of an NVM is re-vectored to a non-defective block of a second band, where the second band is in the same plane or DIP as the first band.

Figure 5:
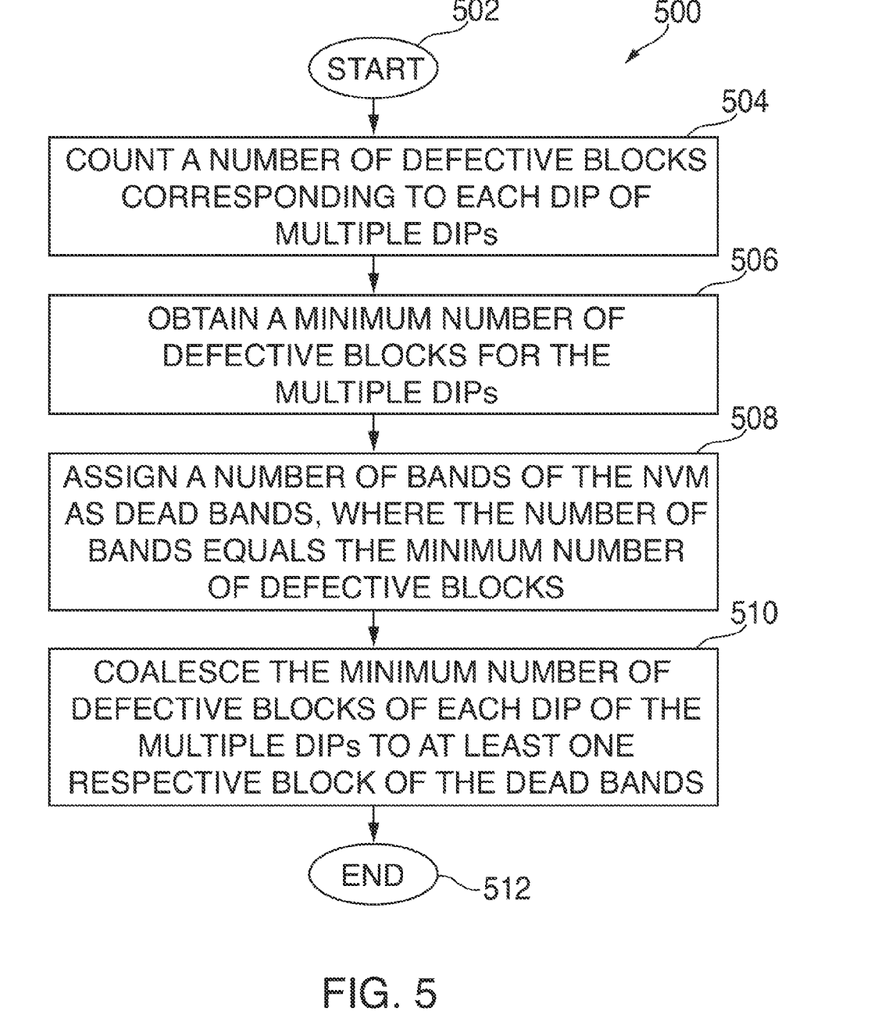
FIG. 5 is a flowchart of an illustrative process for coalescing defective blocks in accordance with various embodiments of the invention.

Referring now to FIG. 5, a flowchart of an illustrative process 500 is shown for coalescing defective blocks. Process 500 may be executed by one or more components of a system (e.g., electronic device 100 of FIG. 1 or electronic device 200 of FIG. 2). For example, at least some of the steps may be performed by a control circuitry (e.g., SoC control circuitry 112 of FIG. 1) or an NVM interface (e.g., NVM interface 118 of FIG. 1 or NVM interface 218 of FIG. 2). For the sake of simplicity, however, the steps of process 500 will be described as being performed by a control circuitry.

Process 500 may begin at step 502, and at step 504, a control circuitry can count a number of defective blocks corresponding to each DIP of multiple DIPs of the NVM. In some cases, the number of defective blocks corresponding to the multiple DIPs can be stored in an array.

For example, Table 3 can be generated after the control circuitry has counted the number of defective blocks for each DIP of NVM 400 (FIG. 4).

TABLE 3

|  | DIP | | | |
| --- | --- | --- | --- | --- |
|  | 0 | 1 | 2 | 3 |
| Number of Defective Blocks | 2 | 3 | 1 | 1 |

At step 506, the control circuitry can obtain a minimum number of defective blocks for the multiple DIPs.

In some cases, the control circuitry can apply a minimum function to the array. For example, the control circuitry can apply the following equation to obtain the minimum number of defective blocks:

$$\min(\text{array}) \tag{1},$$

where array corresponds to an array structure containing the number of defective blocks corresponding to each DIP of the multiple DIPs. Thus, after applying equation (1) to the array of Table 3, the minimum number of defective blocks can be equal to one (e.g., corresponding to DIPs 2 and 3). In other words, all DIPs of the NVM have at least one defect.

After searching the array to find the minimum number of defective blocks, at step 508, the control circuitry can assign a number of bands of the NVM as dead bands, where the number of bands equals the minimum number of defective blocks. The dead bands can be fully parted out so that they are no longer in circulation in the system. In other words, a translation layer (e.g., translation layer 214 of FIG. 2) may no longer use these bands for programming data. Dead bands can correspond to bands in a dead region of the NVM (e.g., dead region 306 of FIG. 3). In some cases, the dead bands can be one or more bands at the end of the NVM.

For example, referring back to Table 3 and FIG. 4, because the minimum number of defective blocks is equal to one, the control circuitry can assign one band (e.g., band 8) as a dead band.

Then, at step 510, the control circuitry can coalesce the minimum number of defective blocks of each DIP of the multiple DIPs to at least one respective block of the dead bands. In some cases, in order to locate at least one defective block, each DIP can be searched in a decreasing order of band numbers. In other words, each DIP can be searched starting from a block corresponding to an end band until a defective block is found. As used herein, the "end band" can be the last band in a utility region of the NVM.

For example, referring back to FIG. 4, after assigning band 8 as a dead band, bands 0-7 can correspond to bands in a utility region of NVM 400, where band 7 is the end band. Thus, for DIP 0, the control circuitry can search its blocks in a decreasing order of band numbers (e.g., the block corresponding to band 7, followed by the block corresponding to band 6, and so on) until a defective block is found (e.g., block 404). The control circuitry can repeat this process for each DIP of the NVM (e.g., DIPs 1-3).

After locating the at least one defective block in a DIP, the control circuitry can re-vector (e.g., re-map) the at least one defective block to at least one respective block of the dead band. For instance, as shown in FIG. 4, the arrows can indicate where defective blocks can be re-mapped. For instance, defective block 404 can be re-mapped to block 416 of dead band 8, and defective block 410 can be re-mapped to block 418 of dead band 8. In addition, defective block 412 can be re-mapped to block 420 of dead band 8, and defective block 414 can be re-mapped to block 422 of dead band 8. Once the minimum number of defective blocks of each DIP has been coalesced to one or more dead bands, process 500 may end at step 512.

Accordingly, process 500 can allow defective blocks to be re-mapped to other blocks having the same DIP but corresponding to a different band. In this way, defects in an NVM can be pushed to the end of band space. Moreover, as compared to systems where blocks are pre-allocated as replacement blocks but are not otherwise used until they replace one or more defective blocks, the current approach conserves physical space. This is because the dead region can be sized such that it is completely used as a destination for re-vectoring (e.g., all blocks are defective blocks). Consequently, more physical space (e.g., a larger user region) can be made available to a translation layer.

Figure 6:
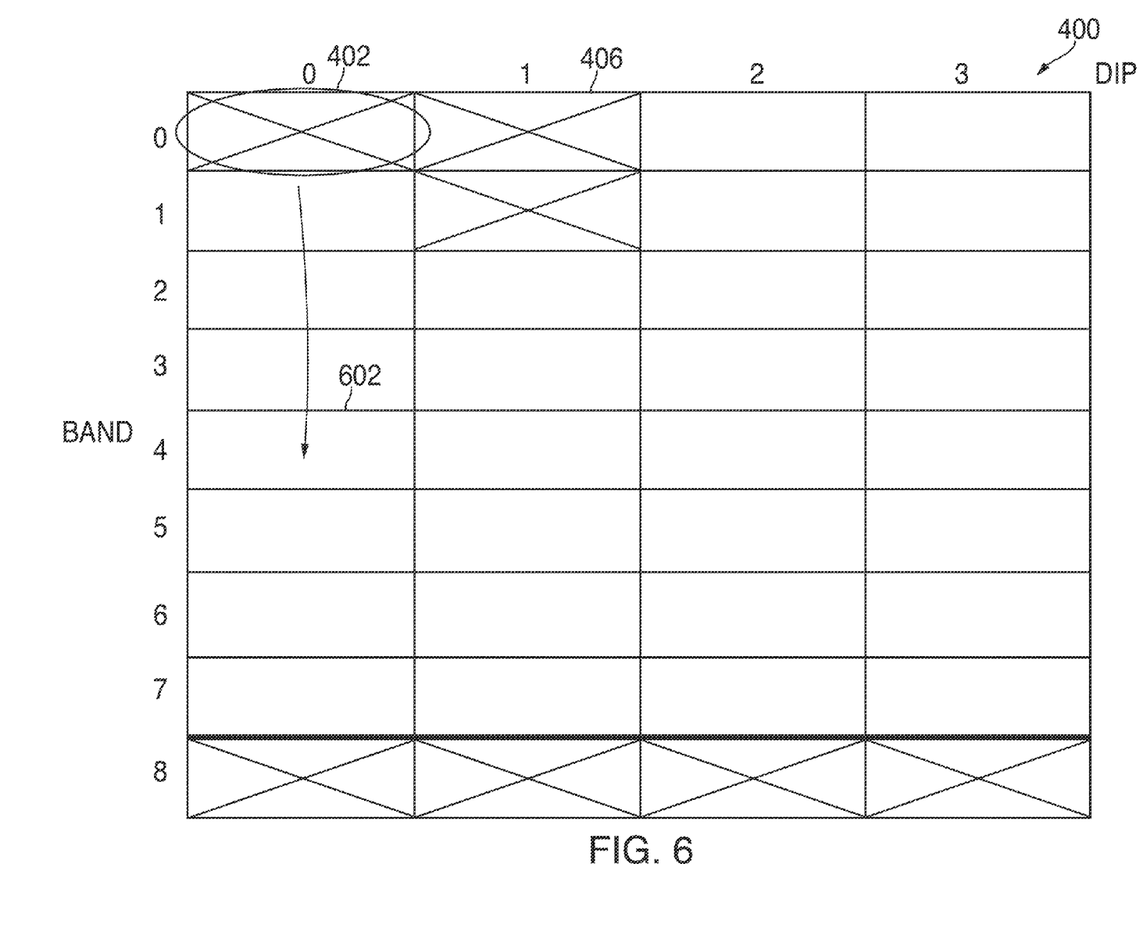
FIG. 6 is a two-dimensional representation of the non-volatile memory of FIG. 4, after defective blocks have been coalesced, in accordance with various embodiments of the invention.

Referring now to FIG. 6, a two-dimensional representation of NVM 400 after defective blocks in DIPs 0-3 have been re-mapped to dead band 8. Table 4 illustrates the various performance levels and the corresponding number of bands of NVM 400 as shown in FIG. 6.

TABLE 4

|  | 100% Performance | 75% Performance | 50% Performance |
|---|---|---|---|
| Number of Bands | 6 | 1 | 1 |

Thus, in comparison to Table 2, instead of having nine bands that are allocated for the user region, NVM 400 now has eight bands (e.g., bands 0-7) that are allocated for the user region and one band (e.g., band 8) that is allocated for the dead region. However, the number of bands having full performance has increased from three to six. In addition, the number of bands having 75% performance has decreased from three to one, and the number of bands having 50% performance has decreased from two to one. Because bands 0-7 of the user region now have more consistent performance, overall system performance can be improved.

In some embodiments, after defective blocks have been re-vectored to a dead region, the band space in the user region can be inspected. In particular, a control circuitry can count any remaining defective blocks (e.g., step overs) in the user region, and can determine whether to vertically re-vector one or more of the defective blocks.

Figure 7:
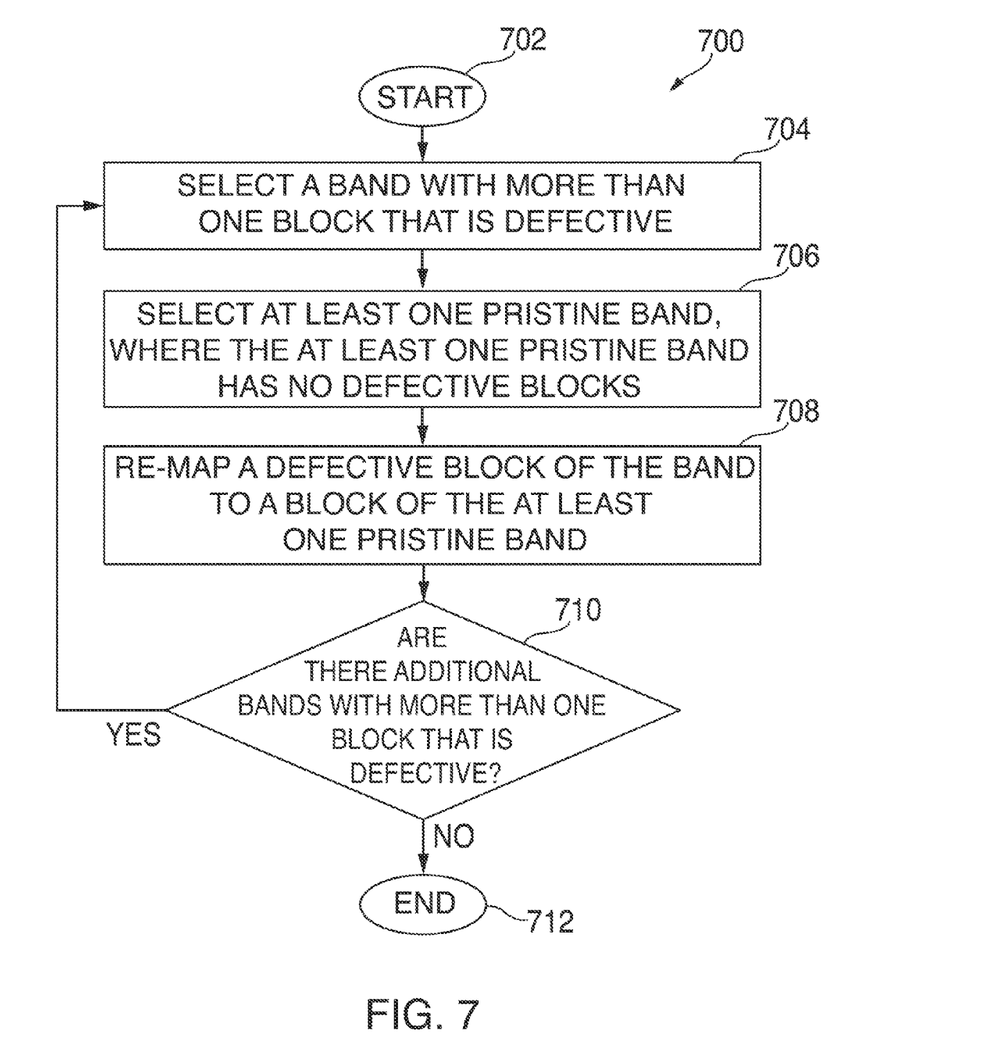
FIG. 7 is a flowchart of an illustrative process for re-mapping defective blocks in accordance with various embodiments of the invention.

For example, turning now to FIG. 7, a flowchart of an illustrative process 700 is shown for re-mapping a defective block. Process 700 may be executed by one or more components of a system (e.g., electronic device 100 of FIG. 1 or electronic device 200 of FIG. 2). For example, at least some of the steps may be performed by a control circuitry (e.g., SoC control circuitry 112 of FIG. 1) or an NVM interface (e.g., NVM interface 118 of FIG. 1 or NVM interface 218 of FIG. 2). For the sake of simplicity, however, the steps of process 700 will be described as being performed by a control circuitry.

Process 700 may begin at step 702, and at step 704, the control circuitry can select a band of an NVM (e.g., NVM 120 of FIG. 1, NVM 220 of FIG. 2, or NVM 400 of FIGS. 3, 4, 6, and 8) with more than one block that is defective by, for instance, scanning the NVM. The band can be in a user region of the NVM (e.g., user region 304 of FIG. 3). For example, as shown in FIG. 6, the control circuitry can select band 0, which has two defective blocks corresponding to DIPs 0 and 1 (e.g., blocks 402 and 406).

Referring back to FIG. 7, at step 706, the control circuitry can select at least one pristine band, where the at least one pristine band has no defective blocks. The at least one pristine band can be another band in the user region. In some cases, the control circuitry can select the at least one pristine band by checking a clean list maintained in volatile memory (e.g., memory 114 of FIG. 1) or the NVM. The clean list can be a list of bands of the NVM with no defective blocks. For instance, as shown in FIG. 6, the control circuitry can select pristine band 4 of NVM 400. In some cases, after selecting a pristine band from the clean list, the control circuitry can remove the pristine band from the clean list.

Continuing to step 708, the control circuitry can re-map a defective block of the band to a block of the at least one pristine band. In some cases, the re-mapping can be a vertical re-mapping (e.g., vertical re-vectoring). That is, the defective block can have the same DIP as the block of the at least one pristine band. For example, as shown by the arrow in FIG. 6, the control circuitry can re-map block 402 to block 602.

At step 710, the control circuitry can determine whether there are additional bands with more than one block that is defective. If, at step 710, the control circuitry determines that there are no other bands with more than one block that is defective, process 700 may end at step 712.

If, at step 710, the control circuitry instead determines that there are other bands with more than one block that is defective, process 700 may return to step 704, where the control circuitry can continue to vertically re-map one or more defective blocks to pristine bands. Thus, if a band has two or more defective blocks, the control circuitry can select a number of pristine bands for the band, where the number of pristine bands is equal to the number of defective blocks of the band subtracted by one. In other words, once a pristine band has been used for re-vectoring a defective block, the previously pristine band will not be selected again.

By performing process 700 for all bands having more than one defective block, the defects per band distribution can be flattened. Thus, at the end of process 700, there will be no bands that have more than one defect.

Figure 8:
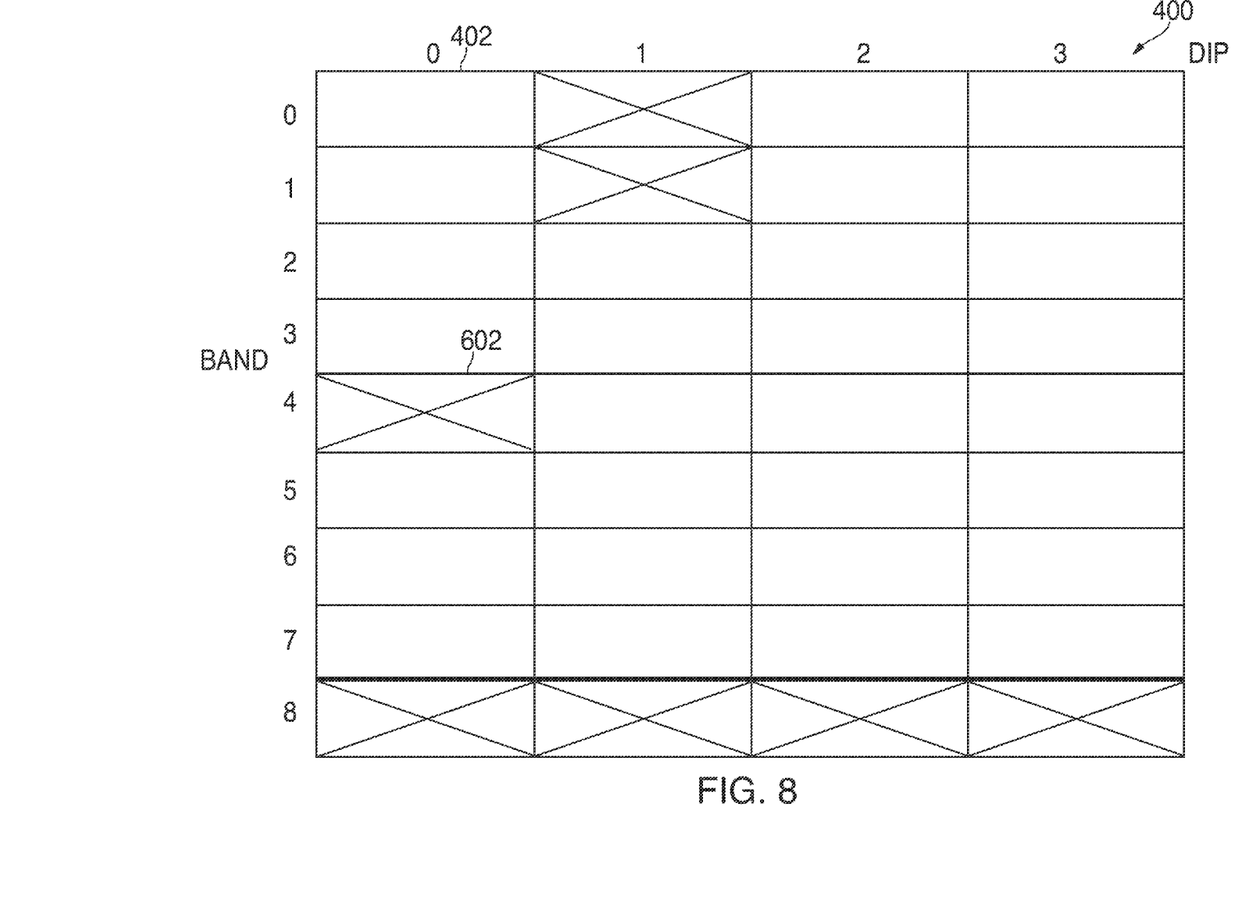
FIG. 8 is a two-dimensional representation of the non-volatile memory of FIG. 6, after defective blocks have been re-mapped, in accordance with various embodiments of the invention.

Turning now to FIG. 8, a further two-dimensional representation of NVM 400 is shown after defective block 402 has been re-mapped to block 602. In particular, Table 5 illustrates the various performance levels and the corresponding number of bands of NVM 400 as shown in FIG. 8.

TABLE 5

|  | 100% Performance | 75% Performance | 50% Performance |
|---|---|---|---|
| Number of Bands | 5 | 3 | 0 |

Thus, in comparison to Table 4, although the number of bands having full performance has decreased from six to five, there are now no blocks that have 50% performance. In other words, each block of the user region either has zero step overs or only one step over. Thus, by smoothing the performance distribution (e.g., spreading defective blocks evenly across multiple bands), overall system performance can be improved. In particular, the NVM can run at a faster speed and have a more consistent performance. Moreover, the physical capacity of the user region of NVM 400 can remain the same because all functional blocks are being utilized (e.g., there are no functional blocks that are reserved as replacement blocks).

In some embodiments, at run-time, the control circuitry can continue to monitor the number of vertical re-vectors per plane (e.g., per DIP). If the control circuitry determines that at least one vertical re-vector has been performed on all DIPs, a band of the user region can be taken out of circulation and allocated as a dead band. Thus, the system can continuously re-balance the number of defects per plane or DIP.

Figure 9:
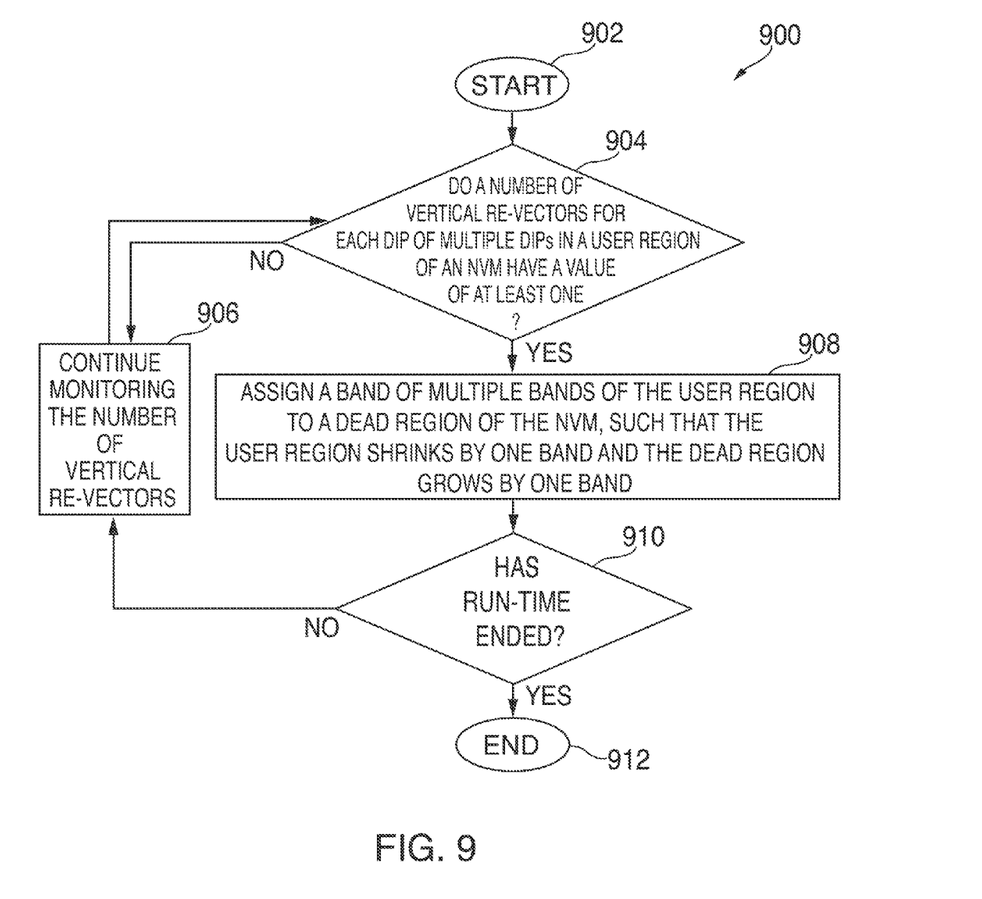
FIG. 9 is a flowchart of an illustrative process for assigning a band from a user region of a non-volatile memory to a dead region of the non-volatile memory in accordance with various embodiments of the invention.

For example, turning now to FIG. 9, a flowchart of illustrative process 900 is shown for assigning a band from a user region of an NVM to a dead region of the NVM. Process 900 may be executed by one or more components of a system (e.g., electronic device 100 of FIG. 1 or electronic device 200 of FIG. 2). For example, at least some of the steps may be performed by a control circuitry (e.g., SoC control circuitry 112 of FIG. 1) or an NVM interface (e.g., NVM interface 118 of FIG. 1 or NVM interface 218 of FIG. 2). For the sake of simplicity, however, the steps of process 900 will be described as being performed by a control circuitry.

Process 900 may begin at step 902. Process 900 may occur during system run-time. At step 904, the control circuitry can determine whether a number of vertical re-vectors for each DIP of multiple DIPs in a user region of an NVM (e.g., user region 304 of FIG. 3) has a value of at least one. The number of vertical re-vectors can be a number of blocks that have been re-mapped from one band of the user region to a different band (e.g., a pristine band) of the user region. In some cases, the control circuitry can determine the number of vertical re-vectors by monitoring the number of pristine bands with a block that has been re-mapped as a defective block (e.g., in a process that is similar to or the same as process 700 of FIG. 7).

If, at step 904, the control circuitry determines that the number of vertical re-vectors for each DIP of the multiple DIPs does not have a value of at least one, process 900 may move to step 906. At step 906, the control circuitry can continue monitoring the number of vertical re-vectors.

If, at step 904, the control circuitry instead determines that the number of vertical re-vectors for each DIP of the multiple DIPs has a value of at least one, process 900 may move to step 908. At step 908, the control circuitry can assign a band of multiple bands of the user region to a dead region of the NVM (e.g., dead region 306 of FIG. 3), such that the user region shrinks by one band and the dead region grows by one band. This way, the band that is taken out of circulation can be used to repair one or more bands with defective blocks. In some embodiments, a process similar to process 500 (FIG. 5) can be followed. That is, the control circuitry can coalesce a defective block of each DIP of the multiple DIPs to a respective block (e.g., a block with the same DIP) of the band.

In some embodiments, the assignment process may need to be coordinated with a garbage collection process. In particular, the system may require that the band that is assigned to the dead region to be a band that is currently being used to store only invalid data (e.g., not currently being used to store valid data). As used herein, "valid data" can be user data and/or system data.

Continuing to step 910, the control circuitry can determine whether run-time has ended. If, at step 910, the control circuitry determines that run-time has ended, process 900 may end at step 912.

If, at step 910, the control circuitry instead determines that run-time has not ended, process 900 may return to step 906. At step 906, the control circuitry can continue monitoring the number of vertical re-vectors.

Accordingly, by performing vertical re-vectoring during run-time, the number of system defects can be smoothed (e.g., each band of the user region can be smoothed to have either zero or one defect). In addition, the physical capacity of the user region remains constant. In some embodiments, depending on one or more factors (e.g., available space in volatile memory), vertical re-vectoring can be enabled or disabled at run-time.

It should be understood that processes 500, 700, and 900 of FIGS. 5, 7, and 9 are merely illustrative. Any of the steps may be removed, modified, or combined, and any additional steps may be added, without departing from the scope of the invention.

The described embodiments of the invention are presented for the purpose of illustration and not of limitation.

What is claimed is:

1. A method for achieving consistent performance in a non-volatile memory ("NVM") comprising a plurality of die's planes ("DIPs"), the method comprising:
    counting a number of defective blocks corresponding to each DIP of the plurality of DIPs;
    obtaining a minimum number of defective blocks for the plurality of DIPs;
    assigning a number of bands of the NVM as dead bands, wherein the number of bands equals the minimum number of defective blocks; and
    coalescing the minimum number of defective blocks of each DIP of the plurality of DIPs to at least one respective block of the dead bands.

2. The method of claim 1, wherein the dead bands are bands at the end of the NVM.

3. The method of claim 1, further comprising storing the plurality of defective blocks of the NVM in an array.

4. The method of claim 3, wherein the obtaining the minimum number of defective blocks further comprises applying a minimum function to the array.

5. The method of claim 1, wherein the coalescing the minimum number of defects comprises:
    searching each DIP of the plurality of DIPS in a decreasing order of band numbers to locate at least one defective block; and
    re-vectoring the at least one defective block to the at least one respective block of the dead bands.

6. The method of claim 1, further comprising scanning the NVM for at least one band with more than one defective block.

7. The method of claim 6, wherein the defective block is a step over.

8. The method of claim 6, further comprising:
    selecting a pristine band of the NVM, wherein the pristine band comprises no defective blocks;
    re-vectoring one of the more than one defective block of the at least one band to a block of the pristine band.

9. The method of claim 8, wherein the one of the more than one defective block has the same DIP as the block of the pristine band.

10. The method of claim 8, wherein the selecting the pristine band comprises checking a clean list comprising a list of bands with no defective blocks.

11. A system comprising:
    non-volatile memory ("NVM") comprising a user region and a dead region, wherein the user region and the dead region comprises a plurality of die's planes ("DIPs"); and
    memory interface comprising control circuitry operative to:
        determine, during system run-time, whether a number of vertical re-vectors for each DIP of the plurality of DIPs has a value of at least one; and
        in response to determining that the number of vertical re-vectors for each DIP of the plurality of DIPS has a value of at least one, assign a band of a plurality of bands of the user region to the dead region, such that the user region shrinks by one band and the dead region grows by one band.

12. The system of claim 11, wherein the control circuitry is operative to coordinate assigning the band with a garbage collection process.

13. The system of claim 11, wherein the band comprises only invalid data.

14. The system of claim 11, wherein the number of vertical re-vectors comprise a number of blocks that have been re-mapped from one band of the user region to a different band of the user region.

15. The system of claim 11, wherein a physical capacity of the user region remains constant.

16. The system of claim 11, wherein the control circuitry is operative to coalesce a defective block of each DIP of the plurality of DIPs to a respective block of the band.

17. The system of claim 16, wherein the respective block has the same DIP as the defective block.

18. The system of claim 11, wherein each band of the plurality of bands of the user region has one of zero defect and one defect.

19. The system of claim 11, wherein the NVM comprises a utility region.

20. The system of claim 11, wherein all blocks of the user region are in circulation in the system.

21. A memory interface for smoothing defects in a non-volatile memory ("NVM"), the memory interface comprising control circuitry operative to:
for each band of the NVM with more than one block that is defective, select at least one pristine band, wherein the at least one pristine band has no defective blocks; and
re-map a defective block of the band to a block of the at least one pristine band.

22. The memory interface of claim 21, wherein the control circuitry is further operative to select a number of pristine bands for the band, wherein the number of pristine bands is equal to the number of defective blocks of the band subtracted by one.

23. The memory interface of claim 21, wherein the band and the at least one band are in a user region of the NVM.

24. The memory interface of claim 23, wherein the user region of the NVM is available to be used by a flash translation layer ("FTL").

25. The memory interface of claim 21, wherein the defective block and the block of the at least one pristine band have the same die's plane ("DIP").

26. The memory interface of claim 21, wherein the at least one pristine band is selected from a clean list.

27. The memory interface of claim 26, wherein after selecting the at least one pristine band, the control circuitry is operative to remove the at least one pristine band from the clean list.

* * * * *